(12) United States Patent
Edwards et al.

(10) Patent No.: US 9,601,479 B2
(45) Date of Patent: Mar. 21, 2017

(54) PROTECTION CIRCUIT, CIRCUIT EMPLOYING SAME, AND ASSOCIATED METHOD OF OPERATION

(71) Applicant: Freescale Semiconductor, Inc., Austin, TX (US)

(72) Inventors: William E. Edwards, Ann Arbor, MI (US); John M. Pigott, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 301 days.

(21) Appl. No.: 14/212,777

(22) Filed: Mar. 14, 2014

(65) Prior Publication Data

US 2015/0263504 A1 Sep. 17, 2015

(51) Int. Cl.
H01L 27/02 (2006.01)

(52) U.S. Cl.
CPC ................................ *H01L 27/0255* (2013.01)

(58) Field of Classification Search
CPC .................................................. H01L 27/0255
See application file for complete search history.

(56) References Cited

U.S. PATENT DOCUMENTS

| | | | |
|---|---|---|---|
| 5,122,724 A * | 6/1992 | Criss ...................... | H02H 9/001 323/222 |
| 5,187,653 A * | 2/1993 | Lorenz ................... | H02H 9/001 323/908 |
| 6,049,446 A * | 4/2000 | Ha ......................... | H02H 9/001 340/653 |
| 6,075,391 A * | 6/2000 | Tarantola ............. | H03K 17/063 327/111 |
| 6,346,829 B1 | 2/2002 | Coddington | |
| 6,362,652 B1 | 3/2002 | Oner et al. | |
| 6,744,612 B2 * | 6/2004 | Chen ...................... | H02H 9/001 361/111 |
| 6,781,422 B1 * | 8/2004 | Yang ................ | H03K 17/04123 326/82 |
| 6,836,148 B2 | 12/2004 | Pullen et al. | |
| 7,173,472 B2 | 2/2007 | Chen et al. | |
| 7,274,543 B2 * | 9/2007 | Nishikawa .......... | H01L 27/0266 361/56 |
| 7,382,159 B1 | 6/2008 | Baker | |
| 7,405,595 B2 * | 7/2008 | Yang ................ | H03K 17/04123 326/83 |
| 7,659,754 B2 * | 2/2010 | Thiele .............. | H03K 17/04123 323/284 |

(Continued)

*Primary Examiner* — Scott Bauer

(57) ABSTRACT

A buffer or voltage protection circuit, a circuit including same, and an associated method of operation are disclosed. In one example embodiment, the integrated circuit includes a first input terminal, a first circuit portion having a second input terminal, and a second circuit portion. The second circuit portion includes a transistor device having first, second, and third ports, where the first and second ports are respectively electrically coupled to the first input terminal and second input terminal, respectively. Additionally, the second circuit portion also includes a diode-type device that is electrically coupled between the third port and either a power source or a power input terminal, and a buffer/driver circuit and a capacitor coupled in series between the third and second ports. The second circuit portion operates to prevent the second input terminal from being exposed to an undesirably-high voltage level.

23 Claims, 3 Drawing Sheets

(56) References Cited

U.S. PATENT DOCUMENTS

| | | | |
|---|---|---|---|
| 8,670,219 B2* | 3/2014 | Disney | H03K 17/0822 |
| | | | 361/56 |
| 9,136,699 B2* | 9/2015 | Chang | H02H 9/001 |
| 2012/0059524 A1* | 3/2012 | Caldwell | F04B 49/22 |
| | | | 700/282 |
| 2013/0265683 A1* | 10/2013 | Gueltig | H02H 3/20 |
| | | | 361/86 |
| 2014/0146426 A1* | 5/2014 | Murakami | H03K 19/00315 |
| | | | 361/56 |

* cited by examiner

PROTECTION CIRCUIT, CIRCUIT EMPLOYING SAME, AND ASSOCIATED METHOD OF OPERATION

CROSS-REFERENCE TO RELATED APPLICATIONS

Not Applicable

STATEMENT REGARDING FEDERALLY SPONSORED RESEARCH OR DEVELOPMENT

Not Applicable

FIELD OF THE DISCLOSURE

The present disclosure relates to electrical circuits and, more particularly to circuits that can provide buffering or protection including, for example, such circuits that can be implemented in or in conjunction with integrated circuits (ICs).

BACKGROUND OF THE DISCLOSURE

Many integrated circuits (ICs) and other circuits or electrical devices employ one or more circuit components or other components or devices that are configured to receive and/or operate in response to the application of low voltage signals (and/or to receive and/or operate in low current or lower power conditions). In regard to such circuits or devices, the inadvertent or accidental application of high voltage signals (or high current or high power), even for a short period of time, can result in damage to the circuits or devices or the one or more circuit components or other components or devices therein.

Notwithstanding efforts to minimize the likelihood that such high voltage signals (or high current or high power) are experienced, there still remain circumstances where such events cannot be entirely eliminated. For example, in some ICs such as mixed signal analog ICs, there can be low voltage and high voltage pins situated very closely to one another along the exterior of the IC package, such that there exists a risk of a pin-to-pin short between the low voltage and high voltage pins, for example, during a testing process or due to dendritic growth. Additionally, although efforts have been made to develop circuits or systems intended to minimize inadvertent coupling of the high and low voltage pins or intended to diminish the negative effects of such coupling, a number of such conventional circuits or systems are undesirably complex and/or costly to implement.

Given such concerns it would be advantageous if there could be developed new circuits, circuit components, systems, devices, or other features, and/or methods of operating such circuits, that could alleviate such concerns associated with the application of high voltage signals to (and/or application of high current or high power with respect to) the pins or terminals of ICs or other circuits or electrical devices, where with respect to at least some embodiments such newly-developed features were relatively simple and/or cost-effective to implement.

DETAILED DESCRIPTION

The present inventors have recognized the significance of alleviating concerns associated with the application of high voltage signals to (and/or application of high current or high power with respect to) the pins or terminals of ICs or other circuits or electrical devices. The present inventors have further recognized that, in at least some embodiments, such issues can be addressed by including additional circuitry between an input terminal of the overall circuit and one or more circuit components within the overall circuit that are potentially sensitive to the application of high voltage signals (and/or to the application of high current or high power). In at least some example embodiments encompassed herein, the additional circuitry includes a high voltage protection circuit including one or more components (for example, a mosfet) that serves to protect against the communication of excessively-high voltages from an input terminal to the voltage-sensitive components. Also, in at least some such embodiments, there is an additional component (e.g., a diode) that allows for appropriate direct current (DC) operation, and also a charge pump including an additional buffer circuit that allows for fast alternating current (AC) operation. Further, in at least some such embodiments, there are additional components that provide for electrostatic discharge (ESD) protection and/or avoid threshold shifts associated with leakage currents.

Figure 1:
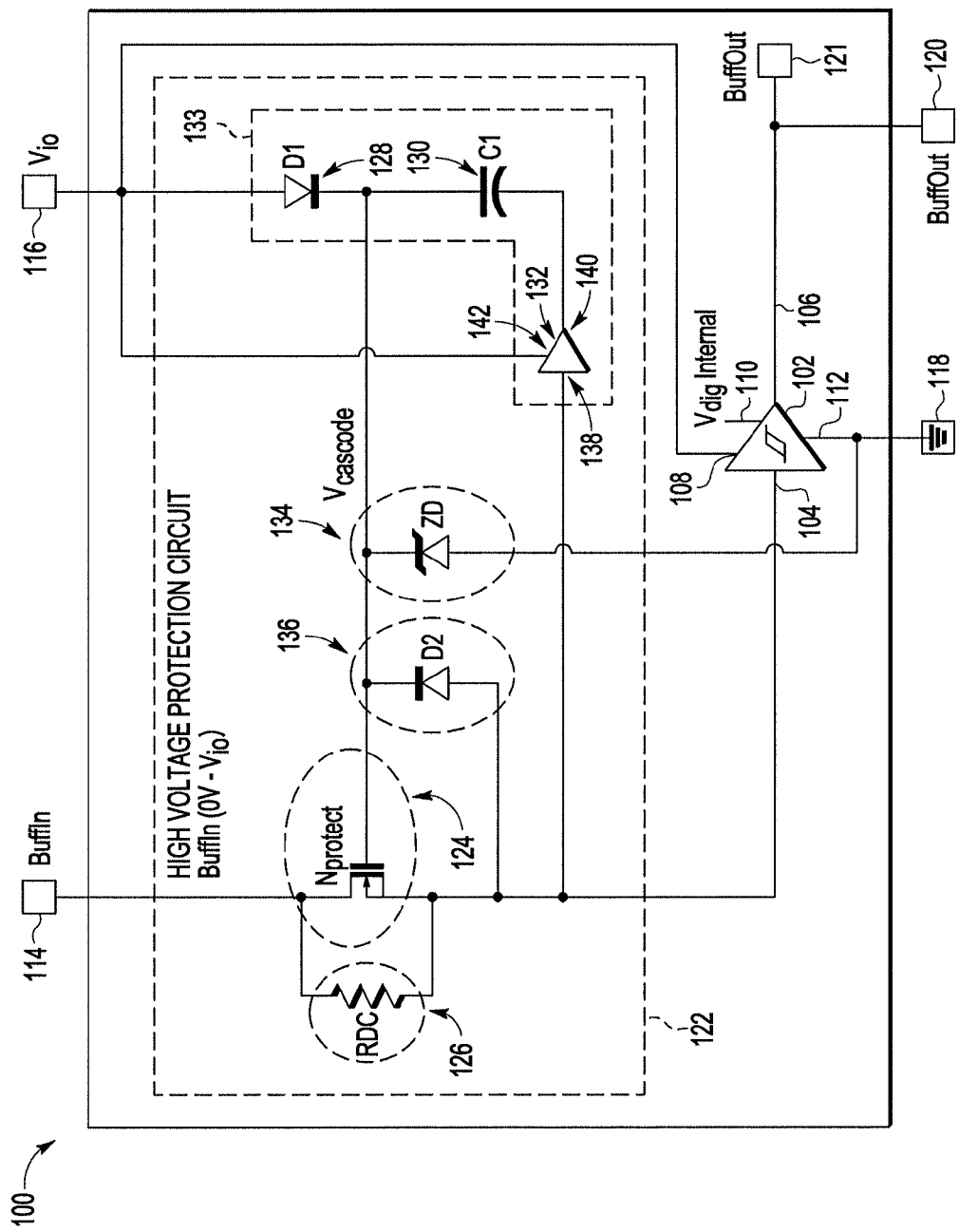
FIG. 1 is a schematic diagram showing an example integrated circuit including an example protection circuit in accordance with one embodiment of the present disclosure.

Referring to FIG. 1, a schematic diagram shows a circuit 100 that is intended to be representative of a variety of different types of circuits having one or more of the features shown and that can be, in at least some embodiments, a portion of an integrated circuit (and is further intended to be representative of at least some embodiments encompassed herein of integrated circuits that include one or more of the features shown in FIG. 1). As shown, the circuit 100 includes first circuit portion that includes a low voltage input buffer circuit (or simply input buffer) 102, and also includes a second circuit portion that includes a high voltage protection circuit 122. The input buffer 102 has several terminals or ports as shown, namely, an input terminal 104, an output terminal 106, a primary power input terminal 108, an additional power input terminal 110 (labeled Vdig Internal), and a ground terminal 112. In the present embodiment, the input buffer 102 is a standard low voltage input buffer, and includes hysteresis with thresholds adjusted to be consistent with specifications of the high voltage protection circuit 122. More particularly, the input buffer 102 is configured to receive low voltage (and/or low current and low power) input signals via the input terminal 104. The output signals provided by the output terminal 106 of the input buffer 102 can be used for a variety of purposes and/or provided to a number of recipients depending on the embodiment, including other circuit components (not shown) within the circuit 100 or possibly to components or devices external to that circuit. Although the input buffer 102 is intended to be representative of any of a variety of different buffer circuits having any of a variety of different operational characteristics, in the present example embodiment the input buffer 102 is a high-speed level shifter that converts input voltages in the range of 0 to 5 volts received at the input terminal 104 into output voltages in the range of 0 to 2½ volts provided at the output terminal 106.

Further as shown in FIG. 1, in the present embodiment, the circuit 100 also includes four input/output (I/O) terminals or ports by which that circuit can send or receive signals and/or power to or from other components or devices external to that circuit. More particularly, the circuit 100 includes an input terminal 114 (labeled as Buff In), a power input terminal 116 (also labeled $V_{io}$), a ground terminal 118, and an output terminal 120 (labeled as Buff Out). In the schematic diagram of FIG. 1, the terminals 114, 116, 118, 120 are shown figuratively as pads or connection locations, although it will be appreciated that in practice these are typically metal pins or leads extending from the main body of the circuit 100 (e.g., at various locations around the perimeter of that circuit). Further as shown, the power input terminal 116 ($V_{io}$) is directly coupled, within the circuit 100, to the power input terminal 108 of the input buffer 102, such that the input buffer receives power. Also, the ground terminal 118 is directly coupled to the ground terminal 112 of the input buffer 102. In the present embodiment, $V_{io}$ can be a supply voltage of 3 volts and Vdig Internal can be set to 2½ volts, albeit in other embodiments these values/settings can vary.

With respect to the input and output terminals, the output terminal 120 of the circuit 100 in the present embodiment is shown to be directly coupled (e.g., short-circuited) to the output terminal 106 of the input buffer 102, such that the output terminal 120 and output terminal 106 are electrically the same node. Nevertheless, in other embodiments, this need not be the case and indeed, in alternate embodiments, there can be any of a variety of additional circuits or circuit components coupled between the output terminal 106 of the input buffer 102 and the output terminal 120. Also, as represented by another pad 121 (also labeled BuffOut), the output signal from the output terminal 106 can also be provided to other internal component(s) of the circuit 100. As for the input terminal 114 and the input terminal 104, in many conventional embodiments of circuits (e.g., in many conventional integrated circuits), the input terminal 114 would be directly coupled (e.g., short-circuited) to the input terminal 104 of the input buffer 102. However, in the present embodiment, the high voltage protection circuit 122 is coupled between the input terminal 114 and the input terminal 104 so as to offer protection to the input buffer 102 from high voltage (and/or possibly high power or high current) signals applied to or received at the input terminal 114, in the event such signals are, inadvertently or for some other reason, applied to the input terminal 114.

Further with respect to the high voltage protection circuit 122, this circuit includes several components as shown in FIG. 1. More particularly, the high voltage protection circuit 122 includes a depletion mode N-channel mosfet (metal-oxide-semiconductor field-effect transistor) 124, where a drain port of the mosfet is coupled directly to (e.g., short-circuited to) the input terminal 114 and a source port of the mosfet is coupled directly to (e.g., short-circuited to) the input terminal 104 of the input buffer 102. Additionally, in the present embodiment, a resistor 126 (having a resistance $R_{DC}$) is coupled in parallel with the mosfet 124 between the drain and source ports of the mosfet. Also, the high voltage protection circuit 122 further includes a first diode 128 (also labeled D1), a first capacitor 130 (having a capacitance C1), and an additional buffer circuit 132, which collectively are shown as a circuit 133, and additionally includes a zener diode 134 (also labeled ZD), and a second diode 136 (also labeled D2). As shown, the first diode 128 is a semiconductor diode that is arranged such that the anode of that diode is directly coupled to (e.g., short-circuited relative to) the power input terminal 116 and the cathode of that diode is directly coupled to (e.g., short-circuited relative to) the gate port of the mosfet 124, and second diode 136 is arranged so that the cathode of that diode is also directly coupled to the gate port of the mosfet and the anode of that diode is directly coupled to the source port of the mosfet 124. Additionally, the zener diode 134 is arranged so that the cathode of that diode is also coupled to the gate port of the mosfet and the anode of that diode is coupled to ground, that is, coupled directly to (e.g., short-circuited to) the ground terminal 118.

Further, the additional buffer circuit 132 and capacitor 130 are coupled in series between the gate port of the mosfet 124 and the source port of the mosfet 124, in parallel with the second diode 136. In the present embodiment, the additional buffer circuit 132 is a non-inverting logic buffer having an input terminal 138 that is the terminal that is coupled to the source port of the mosfet 124, and also having an output terminal 140 that is coupled to the capacitor 130. In other embodiment, the additional buffer circuit 132 can take other forms and/or be replaced with other types of circuits or components including, for example, a driver circuit (and it should therefore be appreciated that any reference to the buffer circuit 132 herein can be equally interpreted as alternatively referring to a driver circuit or the combination of a buffer circuit and a driver circuit). A first terminal of the capacitor 130 is coupled to the gate port of the mosfet 124 (as well as to the cathodes of each of the first diode 128, the second diode 136, and the zener diode 134) and a second terminal of the capacitor is coupled to the output terminal 140 of the additional buffer circuit 132. Also as shown, the additional buffer circuit 132 in the present embodiment additionally includes a power input terminal 142 is directly coupled to (e.g., short-circuited to) the power input terminal 116 to receive power. Although not shown, the buffer component 132 also can have a ground terminal that is directly electrically coupled to (e.g., short-circuited to) the ground terminal 118. Finally, in the present embodiment, the additional buffer circuit 132 is configured to have a threshold voltage (trip point) that is lower than that of the input buffer 102 and to have a propagation delay that is less than a propagation delay of the input buffer 102.

The particular values and characteristics of the electrical circuit components of the high voltage protection circuit 122 can vary depending upon the embodiment. In the present example embodiment, the capacitance C1 of the capacitor 130 can be 500 femtofarads, and the resistance $R_{DC}$ of the resistor 126 can be 1 megaohm, although these values can be different in other embodiments. Also, notwithstanding the particular component arrangement shown, in some alternate embodiments the high voltage protection circuit can take on different arrangements. For example, in one alternate embodiment, the resistor 126 need not at all be present. Also, in another embodiment, the zener diode 134 can be replaced with two series-connected zener diodes (where the cathode of one of the zener diodes is coupled directly to the gate port of the mosfet 124, the anode of the other of the zener diodes is coupled directly to the ground terminal 118, and the remaining anode and cathode terminals of the two zener diodes are coupled together). Also, in another embodiment, the input terminal 114 of the circuit 100 can be coupled to the drain port of the mosfet 124 by way of a low-value resistor (e.g., 1 kohm). Such a coupling would still be substantially direct, with the voltage at the input terminal 114 being substantially the same as that experienced at the drain port of the mosfet. Although each of the first diode 128 and second diode 136 can be a standard diode having merely anode and cathode terminals and operating to provide an approximately 0.7 (e.g., 0.6 to 0.7) volt voltage drop between the anode and the cathode during forward operation of the diode, each of the diodes can also be formed by using other transistor devices (e.g., enhancement mode mosfets) that provide the same or substantially the same manner of operation. Further, the internal componentry of the additional buffer circuit 132 can vary depending upon the embodiment (for example, in at least one other embodiment, the additional buffer circuit can include two inverters coupled in series with one another).

Given the above-described features of the circuit 100 and particularly the high voltage protection circuit 122 thereof, it can further be appreciated that the high voltage protection circuit operates to prevent or limit the application of excessively-high voltages (e.g., in at least some embodiments, above 10 volts) to the input buffer 102 (and particularly to the input terminal 104 thereof) notwithstanding the application of excessively-high voltages (again, e.g., in at least some embodiments, above 10 volts) to the input terminal 114 (BuffIn) of the circuit 100 as follows. More particularly, in the present embodiment, the voltage at the gate port of the mosfet 124, which is shown in FIG. 1 as the $V_{cascode}$ node, is greater than a threshold voltage $V_{TH}$ (for example, 1.5 V) of the mosfet 124, due to the coupling of the $V_{cascode}$ node to the power input terminal 116 ($V_{io}$) via the first diode 128. So long as the voltage applied at the input terminal 114 (BuffIn) is low, the mosfet 124 is on (and the voltage at the gate port of the mosfet, that is, the voltage at the $V_{cascode}$ node, is approximately $V_{io}$ minus 0.7 volts), and the mosfet 124 operates as if or substantially as if, there was merely a small resistance between the drain and source ports of the mosfet (that is, the mosfet appears like a small resistance from drain to source). Under such operation, each of the respective input terminals 104 and 138 of the input buffer 102 and the additional buffer circuit 132, respectively, is at a logic 0, and the capacitor 130 is charged to a voltage of approximately $V_{io}$ minus 0.7 volts.

Additionally, as the voltage applied to the input terminal 114 rises, eventually the additional buffer circuit 132 takes on a logic 1 value, that is, the output voltage provided at the output terminal 140 goes high. When this occurs, then the capacitor 130 serves to pump the voltage at the $V_{cascode}$ node higher, in this embodiment, to approximately a voltage level that is two times the difference of $V_{io}$ minus 0.7 volts (that is, $2\times(V_{io}-0.7)$ volts). Because of this operation, the mosfet 124 continues to remain on (conductive). That is, as the drain port (input port) of the mosfet 124 rises in its voltage, the voltage at the source port follows this change and also rises, with the mosfet 124 continuing to appear merely as a resistor between the drain and source ports (with there being no load on the source port). At the appropriate point, as the voltage at the input terminal 114 continues to increase, the input buffer 102 goes high (attains a logic 1 value), responding to the input at the correct threshold. As already mentioned, the mosfet 124 has the threshold voltage $V_{TH}$, which constitutes the trip point of the additional buffer circuit 132, and this threshold voltage/trip point should be set to be lower than any threshold voltage/trip point of the input buffer 102. Correspondingly, given that the source port of the mosfet 124 is coupled to the input terminal 104 of the input buffer 102, the voltage applied to the input terminal 114 of the circuit 100 is communicated to the input buffer 102 and therefore the input buffer 102 and any circuitry coupled to the output terminal 106 thereof operates as if, or substantially as if, the high voltage protection circuit 122 was not present and the input terminal 104 and input terminal 114 was the same terminal (it can be noted that the additional buffer circuit 132 during the above-described operation already goes high prior to the time at which the input buffer 102 goes high).

Although the above manner of operation continues so long as the voltage applied to the input terminal 114 and thus to the drain port of the mosfet 124 stays beneath a maximum acceptable value, if the voltage applied to the input terminal 114 exceeds that maximum acceptable value such that the voltage applied to the drain port of the mosfet 124 rises higher, the voltage at the source port of the mosfet no longer will follow the change in voltage at the drain port, and particularly the voltage at the source port will rise to, but not above, a voltage approximately equaling two times the difference of $V_{io}$ minus 0.7 volts, further decreased by the aforementioned threshold voltage (that is, $2\times(V_{io}-0.7)-V_{TH}$). That is, the mosfet 124 continues to remain on (conductive) only as long as the drain port remains at a voltage that is at or lower than $((2\times(V_{io}-0.7))-V_{TH})$ volts), but shuts off as the drain port voltage exceeds that level. Thus, the excessive voltage applied to the input terminal 114 is not received at the input terminal 104 and so the input buffer is protected from the excessively-high input voltage. Also, this manner of operation protects the additional buffer circuit 132 from the excessively-high input voltage as well. Additionally, notwithstanding this manner of operation, when the voltage applied to the input terminal 114 (and thus to the drain port of the mosfet 124) subsequently decreases a low level, the additional buffer circuit 132 returns to an off (low) state and this makes it possible for the capacitor 130 to be recharged.

In addition to the above, it should further be noted that, if the voltage received at the input terminal 114 stays high for a long time, it is possible that the capacitor 130 can discharge through leakage currents via the first diode 128. If this circumstance was unaddressed, the high voltage protection circuit 122 might not detect a correct threshold at the input (because the source and drain port voltages of the mosfet 124 might not track). Therefore, to address this issue, in the present embodiment the high voltage protection circuit additionally includes the resistor 126, second diode 136, and zener diode 134 to ensure that under nearly steady state conditions (e.g., when there are slowly moving/slowly changing voltage input signals received at the input terminal 114), and particularly when the voltage input signals received at the input terminal 114 are less than $V_{io}$, the voltage at the source port of the mosfet 124 continues to track the voltage at the drain port of the mosfet (and the voltages at both ports continue to track the voltage at the input terminal 114). It should further be noted that the second diode 136 and zener diode 134 also serve to protect against electrostatic discharge (ESD).

Figure 2:
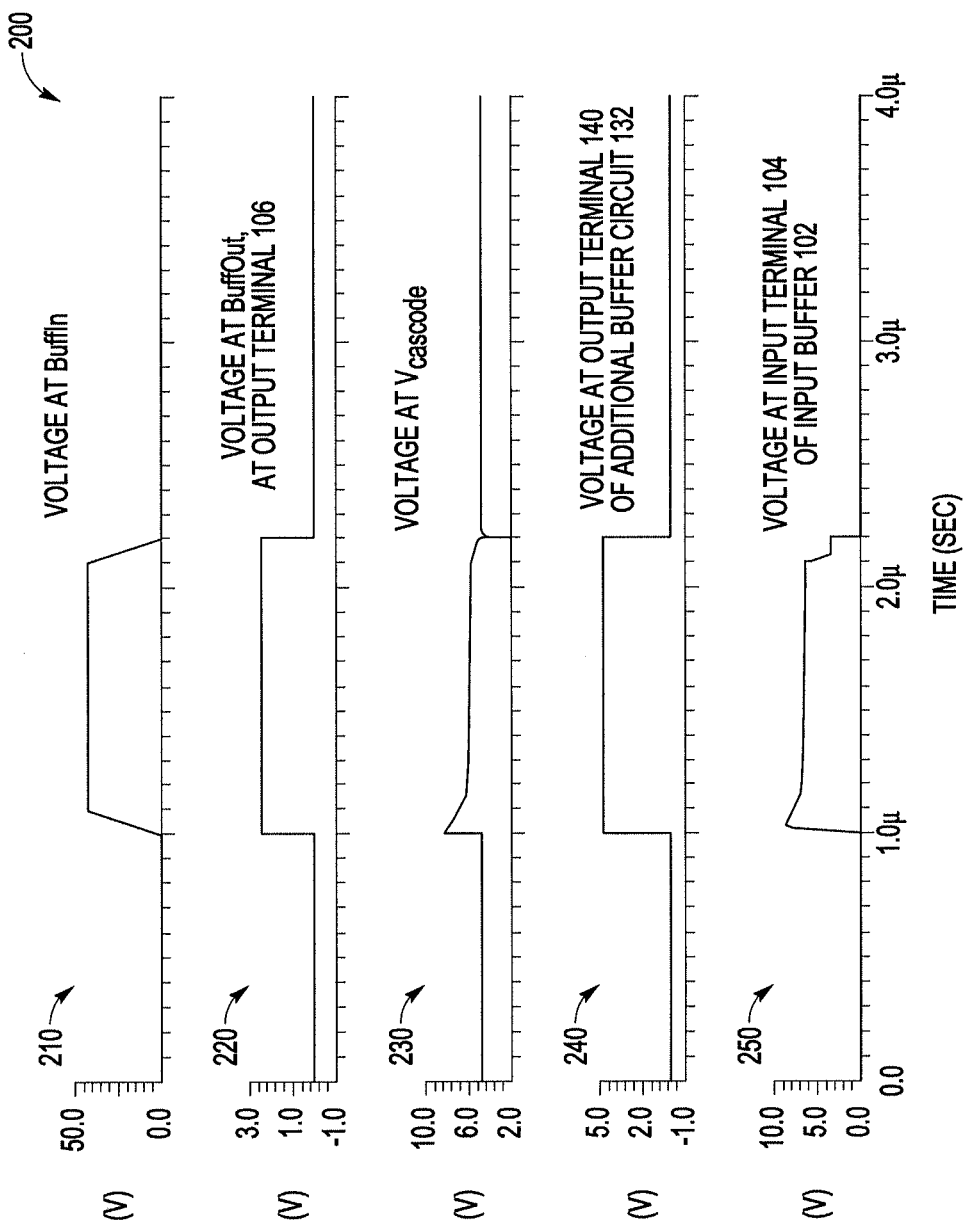
FIGS. 2 and 3 are timing diagrams showing example variations in various voltages experienced by the integrated circuit of FIG. 1 assuming example voltage inputs being received by the integrated circuit.
Figure 3:
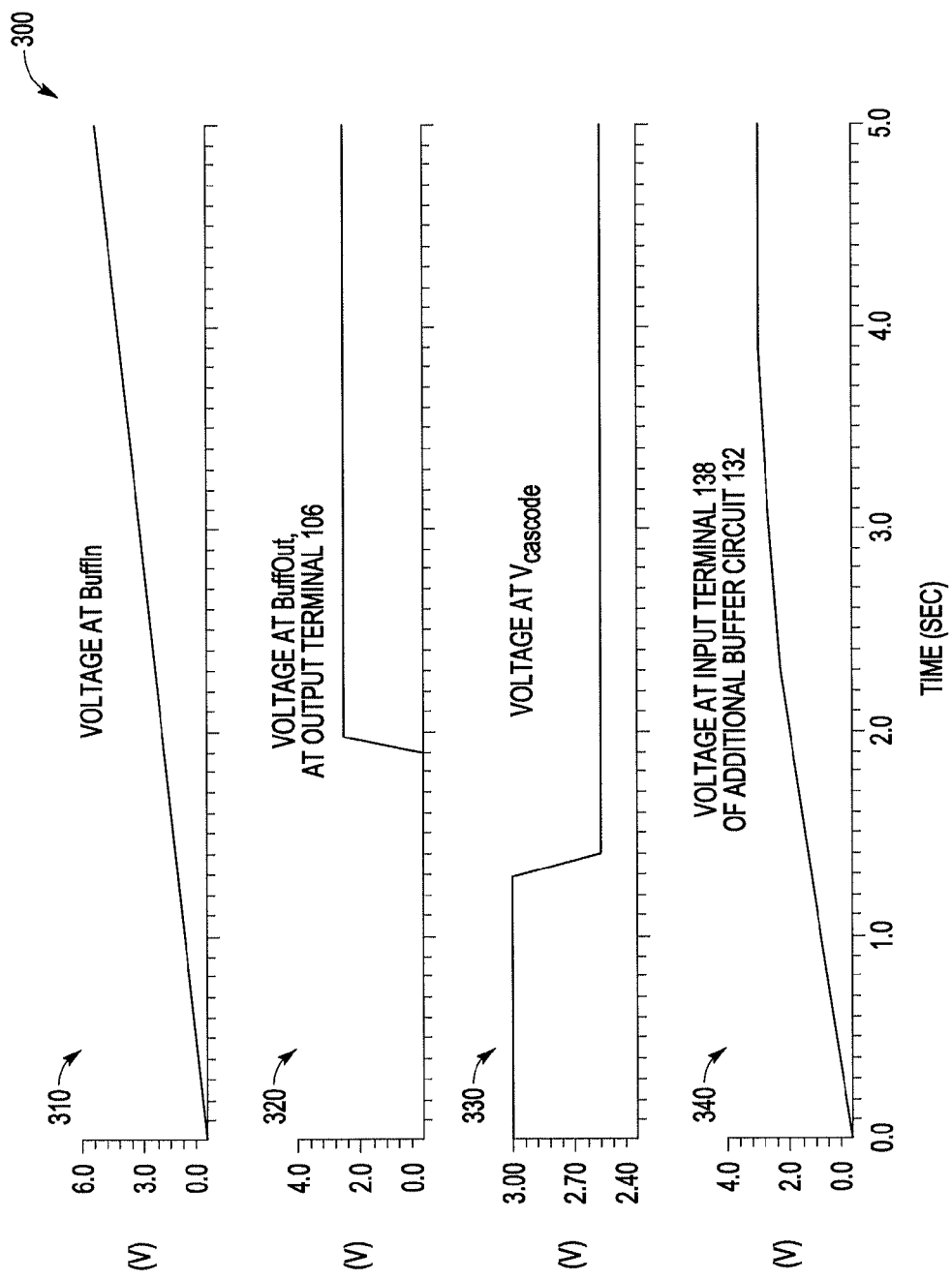

Turning to FIGS. 2 and 3, several timing diagrams are provided to illustrate example operation of the circuit 100 of FIG. 1, particularly in terms of various voltages experienced by that circuit assuming that certain voltages are received at the input terminal 114. FIG. 2 particularly includes a series of timing diagrams 200 that illustrate example operation of the circuit 100 including the high voltage protection circuit 122 thereof to provide voltage protection when a high-voltage spike is received at the input terminal 114. More particularly, a first timing diagram 210 of FIG. 2 shows example voltage input signals where the voltage begins at an initial (low) level and then spikes upward to a second (undesirably-high) level, which in this example is 45 volts. The voltage spike is experienced at the input terminal 114 beginning at a time 1.0 microsecond and ending at a time 2.2 microseconds, and the voltage spike ramps up and ramps down over approximately 100 nanoseconds in each case. Further, a second timing diagram 220 shows the voltage output at the output terminal 106 of the input buffer 102. Also, a third timing diagram 230 shows the voltage at the $V_{cascode}$ node (that is, the voltage at the gate port of the mosfet 124). Further, a fourth timing diagram 240 shows the voltage at the output terminal 140 of the additional buffer circuit 132. Additionally, a fifth timing diagram 250 shows the voltage at the input terminal 138 of the additional buffer circuit, which also is the voltage at the source port of the mosfet 124 as well as the voltage that is applied to the input terminal 104 of the input buffer 102.

As can particularly be appreciated from the fifth timing diagram 250, although the voltage applied to the input terminal 104 of the input buffer 102 does rise in response to the voltage spike received at the input terminal 114, it only initially rises to about 9 volts (rather than 45 volts) and then subsequently decreases to about 7 volts after that time. Mosfet 124 serves to communicate the initial low-voltage level signal (or a first related signal that has a second voltage level that is substantially the same as the first voltage level) received at the input terminal 114 to the input terminal 104 of the input buffer 102. Once the voltage level rises to a point at which the additional buffer circuit 132 is actuated, the mosfet ceases to be conductive between its drain and source ports and consequently the input terminal 104 does not experience a voltage level increase above a maximum voltage level. The maximum level can vary depending upon the embodiment (for example, in one embodiment the input buffer 102 can be rated to receive 5 volt input signals at the input terminal 104 and be further rated to have a maximum input voltage of 7 volts, and so the maximum level in such an embodiment can be 7 volts or alternatively can be a level somewhat higher than the rated maximum, such as 10 volts). Therefore, the high voltage protection circuit 122 operates to shield the input buffer 102 (and particularly the input terminal 104 thereof) from an excessively high voltage above a maximum acceptable voltage notwithstanding the voltage spike occurring at the input terminal 114. It should be appreciated that the maximum voltages that can be received at the input terminal 114, from which the high voltage protection circuit 122 serves to shield the input buffer 102, can also vary depending the upon the embodiment or the operational circumstances (e.g., the maximum voltages received at the input terminal 114 can in some cases be about 14 volts associated with an alternator output and/or in other cases can be up to 40 volts).

Also, it should be particularly appreciated from the third timing diagram 230 that, when the voltage spike first occurs, the capacitor 130 serves to pump the voltage at the $V_{cascode}$ node from merely an initial voltage (again, e.g., as described above, $V_{io}$ minus 0.7 volts) to a higher level (again, e.g., to two times the difference of $V_{io}$ minus 0.7 volts (that is, $2 \times (V_{io} - 0.7)$ volts)). Then subsequently the voltage at the $V_{cascode}$ node decreases even while the spike is continuing, and after the voltage spike has concluded, the voltage at the $V_{cascode}$ node returns to its original level. Also, as shown by the fourth timing diagram 240, the actuating of the additional buffer circuit 132 in this example occurs substantially in conformance with the occurrence of the voltage spike. That is, the additional buffer circuit 132 switches "on" when the voltage received at the input terminal 114 spikes up and switches "off" when the voltage received at the input terminal spikes back down to a low-voltage level that is below the maximum acceptable voltage. It should also be understood that charging of the capacitor 130 can occur at various times by way of current flowing through the first diode 128. Also, at various times, there can be conducting between the gate port of the mosfet 124 and a ground terminal by way of the zener diode 134 and/or conducting between the gate port and the source port of the mosfet by way of the second diode 136.

In FIG. 3, there is provided a series of timing diagrams 300, including first, second, third, and fourth timing diagrams 310, 320, 330, and 340, respectively, which illustrate example operation of the circuit 100 and particularly the high voltage protection circuit 122 thereof when the voltage applied at the input terminal 114 of the circuit 100 is a linearly-increasing voltage (increasing from 0 volts to about 5 volts over about 5 seconds) as illustrated by the first timing diagram 310. Given such a linearly-increasing voltage applied to the input terminal 114, the high voltage protection circuit 122 particularly operates such that the voltage at the $V_{cascode}$ node switches from a higher level (about 3 volts) to a lower level (about 2.5 volts) when the input voltage applied at the input terminal 114 attains a certain level (in this case, about 1.3 volts). This is shown by the third timing diagram 330. Also, the third timing diagram 330 shows the voltage at the $V_{cascode}$ node; that is, the voltage at the gate port of the mosfet 124. Additionally, as shown by the fourth timing diagram 340, the voltage at the input terminal 138 of the additional buffer circuit 132, which is also the voltage at the source port of the mosfet 124 as well as the voltage applied to the input terminal 104 of the input buffer 102, in response to the changing input voltage received at the input terminal 114, also tends to increase but levels off and stops increasing once that voltage reaches approximately 3 volts. Finally, as a result of the increasing voltage received at the input terminal 104 of the input buffer 102, the voltage provided at the output terminal 106 of the input buffer 102 switches from a low level (0 volts) to a high level (about 2.5 volts) as shown in the second timing diagram 320.

Although FIGS. 1, 2, and 3 and the corresponding description provided above show features and operations of one embodiment of a circuit having a high voltage protection circuit encompassed by the present disclosure, it should be appreciated that these are merely examples and the present disclosure is intended to encompass numerous other embodiments having one or more different or additional features and/or manners of operation. As already mentioned for example, in other embodiments, the circuit 100 can be an integrated circuit or other types of circuits (or portions of circuits), and/or the high voltage protection circuit 122 can take other forms. Further, for example, although in the present embodiment the high voltage protection circuit 122 includes the mosfet 124, in other embodiments a different semiconductor or switching device (or devices) can instead be employed including, for example, other types of mosfets (e.g., enhancement mode, P-type, or other types of mosfets), JFETs (junction field effect transistors), etc., with any of such semiconductor/switching device(s) serving particularly to provide high voltage isolation between the received input voltage and the voltage input terminal of the component(s)/device(s) being protected.

Additionally, it should be appreciated that, although examples of other circuit components are shown and discussed above, in other embodiments one or more of those circuit components can take other forms. For example, the diodes shown herein (e.g., the first diode 128 and second diode 136) are examples of diode-type devices, in other embodiments other diode-type devices can be employed. In at least some embodiments, a diode-type device can include any device or structure with anode and cathode nodes which conducts current from anode to cathode when a relatively small voltage is applied (e.g. 0.7 V), but only conducts a relatively small current (e.g. 10 nA) from cathode to anode even when a large voltage (e.g. 10 V) is applied. Also, in some other embodiments for example the high voltage protection circuit can take forms in which the resistor 126 is not present.

Although one or more semiconductor/switching device or devices such as the mosfet 124 or in place of that device are typically present in various embodiments encompassed herein in order to avoid the communication of excessively-high voltages to the voltage-sensitive component(s)/device (s) being protected, one or more others of the above-discussed components discussed above can be absent depending upon the embodiment. Indeed, although in some embodiments there are some such component(s) that allow for desired direct current (DC) operation, charge pumping, alternating current (AC) operation, ESD protection, and/or threshold shifting minimization, other embodiments lack one or more of these components or groups of components and do not achieve some or all of these other types of operation or achieve them to lesser degrees than do the circuits 100, 122 discussed above. Further, although FIGS. 2 and 3 are provided to illustrate certain operational behavior of the circuit 100 and high voltage protection circuit 122 thereof, the particular data shown should be understood as being merely exemplary. That is, the circuit 100 can operate in a variety of manners depending upon the input voltages received at the input terminal 114 as well as other operational circumstances (for example, the input power level received at the power input terminal 116). Also, the operational behavior can be different for other embodiments of the circuit 100 and components thereof.

From the above description, it should additionally be appreciated that circuits employing high voltage protection circuits as encompassed herein are advantageous in that such circuits can provide protection that allows the overall circuits and particularly low voltage (or logic level) components therein (such as the input buffer 102) to survive/withstand high voltages (as can occur due to faults or otherwise) applied to the input terminals of those circuits (e.g., the input terminal or pin 114). The high voltage protection circuits can be implemented independently or substantially independently of the architecture of the circuits (such as the circuit 100) in relation to which the high voltage protection circuits are implemented, and/or independently or substantially independently of the architecture of any support circuits, in a self-contained and independent manner, and no external support circuits or biasing are required in order to implement or operate the high voltage protection circuits (also, the high voltage protection circuits can be implemented in a manner that is achieved with minimal or reduced top level routing and with minimal interactions and contingencies between blocks). The high voltage protection circuits encompassed herein, including but not limited to those specifically described above, not only can provide protection to the particular input buffer 102 shown but also can provide protection to any of a variety of other circuit components and devices connected to the node 104 (or, in other embodiments, to other circuits or devices including, for example, operational amplifiers (op-amps), comparators, etc.). The high voltage protection offered by the high voltage protection circuits can protect the overall circuits in relation to which the high voltage protection circuits are implemented, as well as protect other components of those circuits in relation to which the high voltage protection circuits are implemented, in a variety of contexts including, for example, contexts where there occur direct current (DC) shorts as well as switching environments.

At least some embodiments of the above-described high voltage protection circuits are advantageous in additional respects. In addition to the high voltage protection circuit (and particularly the mosfet therein, e.g., the mosfet 124) protecting against excessively-high voltages from being communicated from the input terminal of the circuit 100 to voltage-sensitive components, the high voltage protection circuit also is advantageous in that it allows for correct direct current (DC) operation, particularly by virtue of the first diode (e.g., the first diode 128), allows for fast alternating current (AC) operation, particularly by virtue of a charge pump formed by the capacitor, first diode, and additional buffer circuit (e.g., the capacitor 130, first diode 128, and additional buffer circuit 132), allows for ESD protection, particularly by virtue of the second diode and zener diode (e.g., the second diode 136 and zener diode 134), and further allows for long term reliability by eliminating threshold shifts induced by leakage currents, particularly by virtue of the second diode (e.g., the second diode 136).

Additionally advantageously, the protection offered by the high voltage protection circuits can be achieved on an integrated circuit without any need for additional terminals or pins on the integrated circuit or any substantial additional internal connections internal to the integrated circuit or block. Further, operation of the high voltage protection circuits such as those described above is advantageous in that power is supplied for the purpose of providing protection (e.g., power flow via the $V_{cascode}$ node) only or substantially only at times when excessively-high-voltages (and/or excessively-high-currents or powers) are being experienced by the circuit 100 (particularly at the input terminal 104 thereof) but not at other times when such events are not occurring, and thus the ongoing operation of the high voltage protection circuits do not result in excessive power drain that might otherwise occur (e.g., as might otherwise occur if power was continuously being supplied/drained via the the $V_{cascode}$ node). Additionally, it should be appreciated that embodiments of integrated circuits and/or other circuits having high voltage protection circuits such as those described above can be utilized in numerous applications and operating environments including, for example, automotive electronics. In at least some such embodiments involving automotive electronics, the automotive electronics are characterized by having functions subjected to voltages that could in at least some circumstances produce undesirable effects upon unprotected devices, and thus such automotive electronics can benefit from additional protection circuits (such as the embodiments of protection circuits described herein) to maintain desired operation.

Although many different embodiments are intended to be encompassed herein, at least some embodiments encompassed herein relate to a circuit that includes a first input terminal, a first circuit portion having a second input terminal, and a second circuit portion. The second circuit portion includes a transistor device having first, second, and third ports, where the first port is electrically coupled to the first input terminal, and where the second port is electrically coupled to the second input terminal. Also, the second circuit portion includes a diode-type device having an anode and a cathode, where the diode-type device is electrically coupled between the third port and either a power source or a power input terminal of the integrated circuit, and an additional circuit and a capacitor coupled in series between the third port and the second port, where an output terminal of the additional circuit is coupled to the capacitor, and where the additional circuit includes either a buffer circuit or a driver circuit.

Also, at least some embodiments encompassed herein relate to a high voltage protection circuit configured to prevent at least one high voltage signal received at a first terminal from being provided to a second terminal. The high voltage protection circuit includes a metal-oxide-semiconductor field-effect-transistor (mosfet) having first, second, and third ports, where the first port is electrically coupled to the first terminal and the second port is electrically coupled to the second terminal. The high voltage protection circuit also includes a diode-type device that is electrically coupled between the third port and either a power source or a further terminal configured to be coupled to the power source, and a buffer or driver circuit and a capacitor coupled in series, at least indirectly, between the third port and the second port, where an output terminal of the buffer or driver circuit is coupled to the capacitor.

Further, at least some embodiments encompassed herein relate to a method of operating an circuit. The method includes receiving a first signal at a first input terminal of the integrated circuit, the first signal having a first voltage level, and communicating the first signal, or a first related signal that has a second voltage level that is substantially the same as the first voltage level, by way of a metal-oxide-semiconductor field-effect-transistor (mosfet) to a second input terminal of the integrated circuit. The method also includes receiving a second signal at the first input terminal, the second signal having a second voltage level that is higher than the first voltage level, and actuating a buffer or driver circuit having an input port directly coupled to a source port of the mosfet and an output port coupled to a capacitor that is series coupled between the output port and a gate port of the mosfet. As a result of the actuating, the second input terminal does not experience a voltage level increase above a maximum voltage level notwithstanding the receiving of the second signal.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A circuit comprising:
   a first input terminal;
   a first circuit portion having a second input terminal, wherein the first circuit portion includes an input buffer that includes the second input terminal and an output terminal; and
   a second circuit portion that includes:
      a transistor device having first, second, and third ports, wherein the first port is electrically coupled to the first input terminal, and wherein the second port is electrically coupled to the second input terminal;
      a diode-type device having an anode and a cathode, wherein the diode-type device is electrically coupled between the third port and either a power source or a power input terminal of the integrated circuit; and
      an additional circuit and a capacitor coupled in series between the third port and the second port, wherein an output terminal of the additional circuit is coupled to the capacitor, and wherein the additional circuit includes either a buffer circuit or a driver circuit,
   wherein one or both of (a) the output terminal is short-circuited to an output pin of the circuit and configured for supplying at least one output signal to another device external to the circuit, or (b) the output terminal is coupled to a third circuit portion included within the integrated circuit.

2. The circuit of claim 1, wherein the transistor device is a metal-oxide-semiconductor field-effect-transistor (mosfet).

3. The circuit of claim 2, wherein the mosfet is a N-channel mosfet, and wherein the first port is a drain port, the second port is a source port, and the third port is a gate port.

4. The circuit of claim 3, wherein the mosfet is a depletion mode N-channel mosfet and the diode-type device is a semiconductor diode having a cathode terminal and an anode terminal, wherein the cathode terminal is coupled to the third port.

5. The circuit of claim 1, wherein the second circuit portion additionally includes at least one zener diode coupled between the third port and a ground terminal.

6. The circuit of claim 5, wherein the second circuit portion additionally includes at least one additional diode-type device coupled between the third port and the second port.

7. The circuit of claim 1, wherein the second circuit portion additionally includes at least one additional diode-type device coupled between the third port and the second port.

8. The circuit of claim 1, further comprising a resistor coupled between the first and second ports, and wherein the second circuit portion operates to prevent the second input terminal from being exposed to a voltage level that is above a maximum acceptable voltage level, notwithstanding the first input terminal being exposed to an undesirably-high voltage.

9. The circuit of claim 1, wherein a first propagation delay of the additional circuit is less than a second propagation delay of the input buffer.

10. A high voltage protection circuit configured to prevent at least one high voltage signal received at a first terminal from being provided to a second terminal, the high voltage protection circuit comprising:
    a metal-oxide-semiconductor field-effect-transistor having first, second, and third ports, wherein the first port is electrically coupled to the first terminal and the second port is electrically coupled to the second terminal;
    a diode-type device that is electrically coupled between the third port and either a power source or a further terminal configured to be coupled to the power source;
    a buffer or driver circuit and a capacitor coupled in series, at least indirectly, between the third port and the second port wherein an output terminal of the buffer or driver circuit is coupled to the capacitor; and
    an additional circuit portion that is electrically coupled to the second terminal, wherein the additional circuit portion is shielded from the at least one high voltage signal by virtue of the high voltage protection circuit.

11. The high voltage protection circuit of claim 10, further comprising at least one zener diode coupled between the third port and a ground.

12. The high voltage protection circuit of claim 11, further comprising at least one additional diode-type device coupled between the third port and the second port, and a resistor coupled between the first and second ports.

13. The high voltage protection circuit of claim 10, wherein the additional circuit portion includes a further buffer circuit and also includes an additional component coupled at least indirectly to an output terminal of the further buffer circuit, and wherein the high voltage protection circuit forms at least a part of an integrated circuit.

14. The high voltage protection circuit of claim 10, further comprising a resistor coupled between the first and second ports.

15. A circuit comprising:
   a first input terminal;
   a first circuit portion having a second input terminal; and
   a second circuit portion that includes:
      a transistor device having first, second, and third ports, wherein the first port is electrically coupled to the first input terminal, and wherein the second port is electrically coupled to the second input terminal;
      a diode-type device having an anode and a cathode, wherein the diode-type device is electrically coupled between the third port and either a power source or a power input terminal of the integrated circuit;
      an additional circuit and a capacitor coupled in series between the third port and the second port, wherein an output terminal of the additional circuit is coupled to the capacitor, and wherein the additional circuit includes either a buffer circuit or a driver circuit; and
      a resistor coupled between the first and second ports, and wherein the second circuit portion operates to prevent the second input terminal from being exposed to a voltage level that is above a maximum acceptable voltage level, notwithstanding the first input terminal being exposed to an undesirably-high voltage.

16. The circuit of claim 15, wherein the transistor device is a metal-oxide-semiconductor field-effect-transistor (mosfet).

17. The circuit of claim 16, wherein the mosfet is a N-channel mosfet, and wherein the first port is a drain port, the second port is a source port, and the third port is a gate port.

18. The circuit of claim 15, wherein the second circuit portion additionally includes at least one zener diode coupled between the third port and a ground terminal, and wherein the second circuit portion additionally includes at least one additional diode-type device coupled between the third port and the second port.

19. The circuit of claim 15, wherein the first circuit portion includes an input buffer that includes the second input terminal and an output terminal, and wherein a first propagation delay of the additional circuit is less than a second propagation delay of the input buffer.

20. The circuit of claim 19, wherein one or both of (a) the output terminal is short-circuited to an output pin of the circuit and configured for supplying at least one output signal to another device external to the circuit, or (b) the output terminal is coupled to a third circuit portion included within the integrated circuit.

21. A high voltage protection circuit configured to prevent at least one high voltage signal received at a first terminal from being provided to a second terminal, the high voltage protection circuit comprising:
   a metal-oxide-semiconductor field-effect-transistor having first, second, and third ports, wherein the first port is electrically coupled to the first terminal and the second port is electrically coupled to the second terminal;
   a diode-type device that is electrically coupled between the third port and either a power source or a further terminal configured to be coupled to the power source;
   a buffer or driver circuit and a capacitor coupled in series, at least indirectly, between the third port and the second port wherein an output terminal of the buffer or driver circuit is coupled to the capacitor; and
   at least one additional diode-type device coupled between the third port and a node, and a resistor coupled between the first and second ports.

22. The high voltage protection circuit of claim 21, wherein the node is the second port.

23. The high voltage protection circuit of claim 22, further comprising at least one zener diode coupled between the third port and a ground, wherein the high voltage protection circuit forms at least a part of an integrated circuit.

* * * * *